US008204234B2

(12) United States Patent
Jeon et al.

(10) Patent No.: US 8,204,234 B2
(45) Date of Patent: Jun. 19, 2012

(54) APPARATUS AND METHOD FOR GENERATING BINAURAL BEAT FROM STEREO AUDIO SIGNAL

(75) Inventors: Jae-Jin Jeon, Anyang-si (KR); Sang-Ki Kang, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 241 days.

(21) Appl. No.: 12/739,920

(22) PCT Filed: Oct. 24, 2008

(86) PCT No.: PCT/KR2008/006302
§ 371 (c)(1),
(2), (4) Date: Apr. 26, 2010

(87) PCT Pub. No.: WO2009/054699
PCT Pub. Date: Apr. 30, 2009

(65) Prior Publication Data

US 2010/0239096 A1 Sep. 23, 2010

(30) Foreign Application Priority Data

Oct. 24, 2007 (KR) ........................ 10-2007-0107299

(51) Int. Cl.
*H04R 5/00* (2006.01)
*H03G 5/00* (2006.01)

(52) U.S. Cl. ................................ 381/1; 381/27; 381/98

(58) Field of Classification Search ................ 381/1, 27, 381/98, 124, 17, 18; 600/26–28, 544, 545
See application file for complete search history.

(56) References Cited

U.S. PATENT DOCUMENTS

| | | | | |
|---|---|---|---|---|
| 4,775,805 | A * | 10/1988 | Whitefoot | 327/115 |
| 5,577,990 | A | 11/1996 | Widjaja et al. | |
| 5,599,274 | A * | 2/1997 | Widjaja et al. | 600/27 |
| 5,796,844 | A * | 8/1998 | Griesinger | 381/18 |
| 6,081,743 | A | 6/2000 | Carter et al. | |
| 6,636,608 | B1 * | 10/2003 | Kishii et al. | 381/18 |
| 7,717,842 | B2 * | 5/2010 | Kwon et al. | 600/28 |
| 2007/0223708 | A1 * | 9/2007 | Villemoes et al. | 381/17 |
| 2008/0125620 | A1 * | 5/2008 | McNew | 600/27 |
| 2010/0076253 | A1 * | 3/2010 | Altman et al. | 600/28 |

FOREIGN PATENT DOCUMENTS

| | | |
|---|---|---|
| KR | 1020050009944 A | 1/2005 |
| KR | 1020050096675 A | 10/2005 |

OTHER PUBLICATIONS

PCT/ISA/237 Written Opinion issued in PCT/KR2008/006302 (4pp), Mailed Feb. 9, 2009.

* cited by examiner

*Primary Examiner* — Hai Phan
(74) *Attorney, Agent, or Firm* — The Farrell Law Firm, P.C.

(57) ABSTRACT

An apparatus and method for generating a binaural beat for brainwave induction is provided. Upon receipt of a stereo audio signal, a decorrelator extracts a common component existing in common in both channels of the stereo audio signal, and outputs the remaining stereo components except for the extracted common component. A frequency shifter generates a common component in which the binaural beat is included, by shifting a frequency of the extracted common component. First and second mixers mix the common component in which the binaural beat is included, with the remaining stereo components.

8 Claims, 4 Drawing Sheets

APPARATUS AND METHOD FOR GENERATING BINAURAL BEAT FROM STEREO AUDIO SIGNAL

PRIORITY

This application claims priority under 35 U.S.C. §119(a) to an application filed in the Korean Intellectual Property Office on Oct. 24, 2007 and assigned Serial No. 10-2007-0107299, and to PCT/KR2008/006302 filed Oct. 24, 2008, the contents of which are incorporated herein by reference.

BACKGROUND OF THE INVENTION

1. Field of the Invention

The present invention relates generally to an apparatus and method for generating binaural beats for brainwave induction, and, in particular, to an apparatus and method for generating binaural beats for brainwave induction from a stereo audio signal.

2. Description of the Related Art

Generally, a brainwave inducer refers to a device for permitting both ears to hear sine waves having a predetermined frequency difference and simultaneously generating lights having the same frequency difference to both eyes of the user, to induce generation of a brainwave having a desired frequency. Such a brainwave inducer has been commercialized and popularized.

According to brainwave research based on the nerve current, which is a field of neuroscience involving study of the brain, it is known that when an external stimulus exerts influence on the brain, transition of brainwave is possible. For example, if a person in his/her beta phase is stimulated by a wave of 10 Hz, the person falls in a stabilized state where he/she is relaxed. The simplest approach to provide such external stimulus is an acoustic method, and a so-called binaural beat technique is used.

The 'binaural beat' refers to a sound which is generated by modulating an input audio signal with a sound in a human's audible frequency band (20~20,000 Hz) and effectively mixing the modulated sounds to influence the brain, in order to form an external wave affecting the brain since the humans cannot perceive low frequencies. That is, an 11 Hz frequency belonging to the alpha phase is an inaudible frequency band, and a frequency difference of 11 Hz is given to the brain by providing a 300 Hz audible frequency band to the left ear and a 311 Hz sound to the right ear using a stereo sound. In this case, the two sounds are mixed in the brain, so the brain receives the frequency difference of 11 Hz, undergoing stimulation by brainwave induction.

For 300 Hz–311 Hz, when 300 Hz is provided to the left ear and 311 Hz to the right ear, the brain perceives 300 Hz–311 Hz=11 Hz.

A human brainwave is an electric signal occurring within the head, and its origin is a current generated by ions that pass through cell walls of the excited neurons. The brainwave is measured through (+, –) electrodes attached on the human's head surface using, for example, Electro Encephalo Graphy (EEG) equipment, and a voltage detected from the (+, –) electrodes should be amplified approximately 6 million times, so the brainwave can be measured, making it possible to indirectly comprehend a state of the brain. The measured brainwave represents a different mental state of the person according to its frequency range, and a relationship between the brainwave and the mental state with respect to the frequency range is shown in Table 1.

TABLE 1

| Frequency range | Brainwave | Mental state |
|---|---|---|
| >40 Hz | Gamma wave | |
| 13~40 Hz | Beta wave | Nervous |
| 7~13 Hz | Alpha wave | Relax |
| 4~7 Hz | Theta wave | Sleep, meditation |
| <4 Hz | Delta wave | Very deep sleep |

As can be understood from Table 1, the brain's frequency, or brainwave, represents the human's mental state that varies instantaneously, and it is discovered that if the brainwave is changed by compulsory brainwave induction, the human's mental state varies. Accordingly, the brainwave inducer is devised to artificially induce the human's mental state.

The method for inducing the brainwave is used for various commercial products, and in many cases, since the sine waves used in this method offend the ears, most products change the reference frequency or add slight noises to the sine waves so that the user can comfortably hear the sine waves.

However, in the method of changing the reference frequency or adding slight noises, the user should be patient in hearing the sound offending the ears for a long while. This is because the user should hear two sine wave sounds having different frequencies for a specific time or longer, in order for the binaural beat effect to last, inducing the brainwave.

Meanwhile, many Internet education companies use the binaural beat effect in order to improve student's concentrations during the study, and to this end, they simply add sine waves to the existing contents and reproduce them, thereby inducing the brainwave. However, even in this service, since the user should hear the sine waves offending the ears for a long time, he/she should annoyingly adjust the volume of both the contents and the sine waves.

Recently, research is being conducted on a method for generating binaural beats using the general voice signal, and the corresponding research generates information on Left (L) and Right (R) channels using a frequency shift block. When the mono voice signal is used in this way, it is possible to generate a natural binaural beat even without using the sine waves.

However, as for the general voice signal, its many parts are composed of silent sounds. Therefore, when the binaural beats are generated using silent periods other than the actual sound periods, the binaural beat effect occurs only in the sound periods without occurring in the silent periods. Thus, the user may feel interruption, and can not be exposed to the binaural beat effect for an extended time, causing a reduction in the brainwave induction effect. Recently, therefore, a brainwave inducer has been proposed, which has resolved the interruption problem using a voice detector.

The brainwave induction method can also be applied to a stereo audio signal, and a description thereof will be made with reference to FIGS. 1 and 2. FIG. 1 is a block diagram illustrating an internal structure of a brainwave induction apparatus according to the prior art, and FIG. 2 is a diagram illustrating two sine waves having different frequencies generated in a conventional brainwave induction apparatus.

Referring to FIGS. 1 and 2, after a mono signal generator 101 generates a mono signal by mixing input stereo audio signals, a frequency shifter 103 shifts a reference frequency 200 in the horizontal frequency direction at regular intervals, generating a shifted frequency 210.

However, in the above simple frequency shifting scheme, the stereoscopic feeling necessary for music listening may completely disappear in the process of mixing the stereo audio signals into a mono signal. In this case, vocal signals which are the signals existing in common in both channels of the stereo audio signals are emphasized, but accompaniments being input to the two channels with different phases and magnitudes are relatively reduced, causing considerable degradation of sound quality. Therefore, the conventional brainwave induction method proposed in FIGS. 1 and 2 cannot be directly applied to the stereo audio signals.

SUMMARY OF THE INVENTION

An aspect of the present invention is to address at least the problems and/or disadvantages of conventional systems and methods, and to provide at least the advantages described below. Accordingly, the present invention provides an apparatus and method for generating binaural beats from a stereo audio signal.

Further, the present invention provides an apparatus and method capable of generating binaural beats from a stereo audio signal and preventing distortion of the stereo audio signal.

According to one aspect of the present invention, there is provided an apparatus for generating a binaural beat. The apparatus includes a decorrelator for, upon receipt of a stereo audio signal, extracting a common component existing in both channels of the stereo audio signal, and outputting stereo components except for the extracted common component; a frequency shifter for generating a common component that includes the binaural beat, by shifting a frequency of the extracted common component; and first and second mixers for mixing the common component that includes the binaural beat, with the remaining stereo components.

According to one aspect of the present invention, there is provided a method for generating a binaural beat. The method includes, upon receipt of a stereo audio signal, extracting a common component existing in both channels of the stereo audio signal, and outputting stereo components except for the extracted common component; generating a common component that includes the binaural beat is included, by shifting a frequency of the extracted common component; and mixing the common component that includes the binaural beat, with the remaining stereo components.

BRIEF DESCRIPTION OF THE DRAWINGS

The above and other aspects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will now be described in detail with reference to the annexed drawings. The matters defined in the description such as a detailed construction and elements are provided to assist in a comprehensive understanding of exemplary embodiments of the invention. In the following description, a detailed description of known functions and configurations incorporated herein has been omitted for clarity and conciseness.

Figure 1:
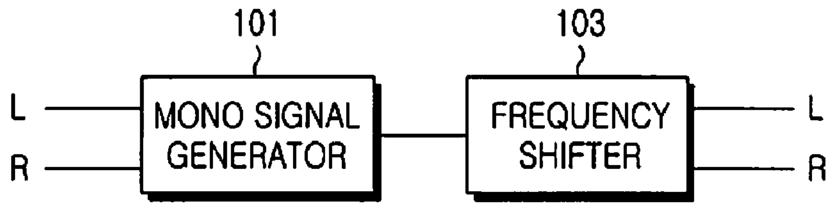
FIG.1 (PRIOR ART)
FIG. 1 is a block diagram illustrating an internal structure of a conventional brainwave induction apparatus.
Figure 2:
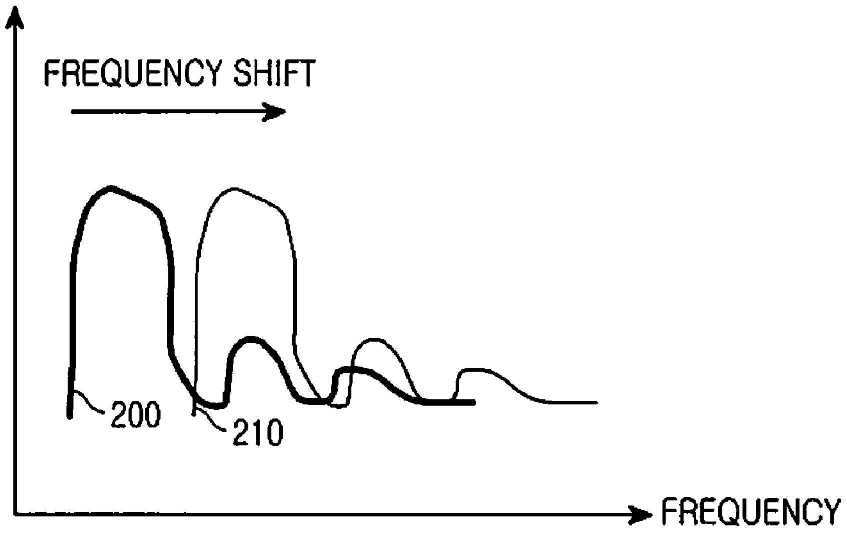
FIG.2 (PRIOR ART)
FIG. 2 is a diagram illustrating two sine waves having different frequencies generated in a conventional brainwave induction apparatus.
Figure 3:
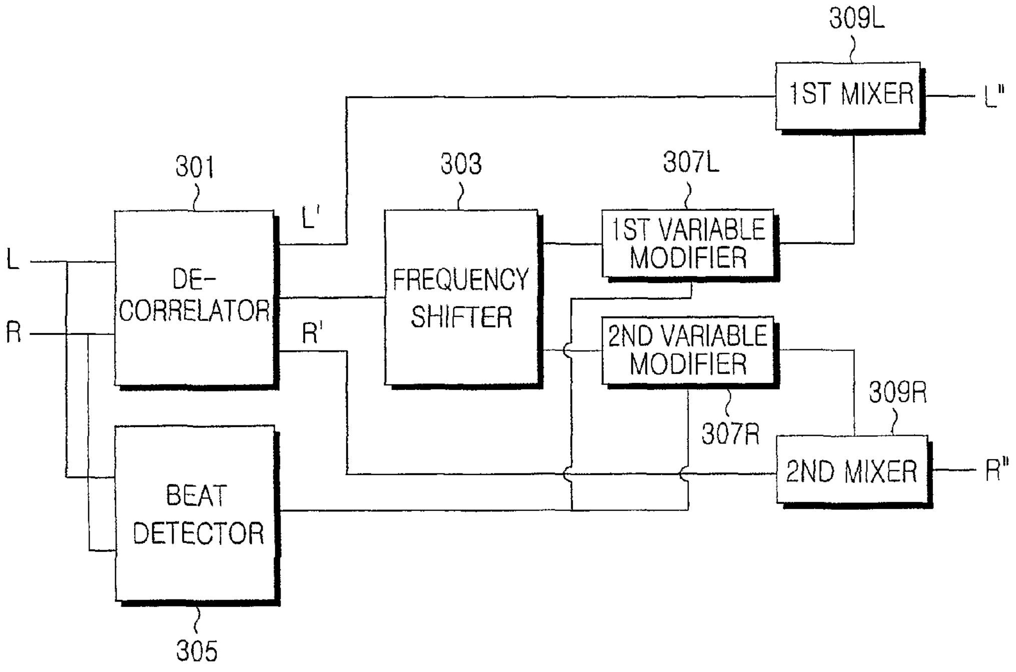
FIG. 3 is a block diagram illustrating an internal structure of an apparatus for generating a binaural beat from a stereo audio signal according to an embodiment of the present invention.

FIG. 3 is a block diagram illustrating an internal structure of an apparatus for generating a binaural beat from a stereo audio signal according to an embodiment of the present invention. According to the present invention, the apparatus for generating a binaural beat includes a decorrelator 301, a frequency shifter 303, a beat detector 305, a first variable modifier 307L, a second variable modifier 307R, a first mixer 309L, and a second mixer 309R.

When a stereo audio signal is received, the decorrelator 301 extracts components that exist in common in both channels (L channel and R channel) of the stereo audio signal, and outputs the remaining stereo components (L' and R') except for the common components. The frequency shifter 303 generates common components having a binaural beat effect by shifting a frequency of the extracted common components. The beat detector 305 detects a tempo of a monaural beat of the received stereo audio signal. The first variable modifier 307L and the second variable modifier 307R adjust strengths of the common components having the binaural beat effect, i.e., common components in which the binaural beats are included, according to the tempo of the monaural beat, detected by the beat detector 305. The first mixer 309L and the second mixer 309R mix the common components output from the first variable modifier 307L and the second variable modifier 307R, with the remaining stereo components (L' and R') generated by the decorrelator 301, respectively.

Figure 4:
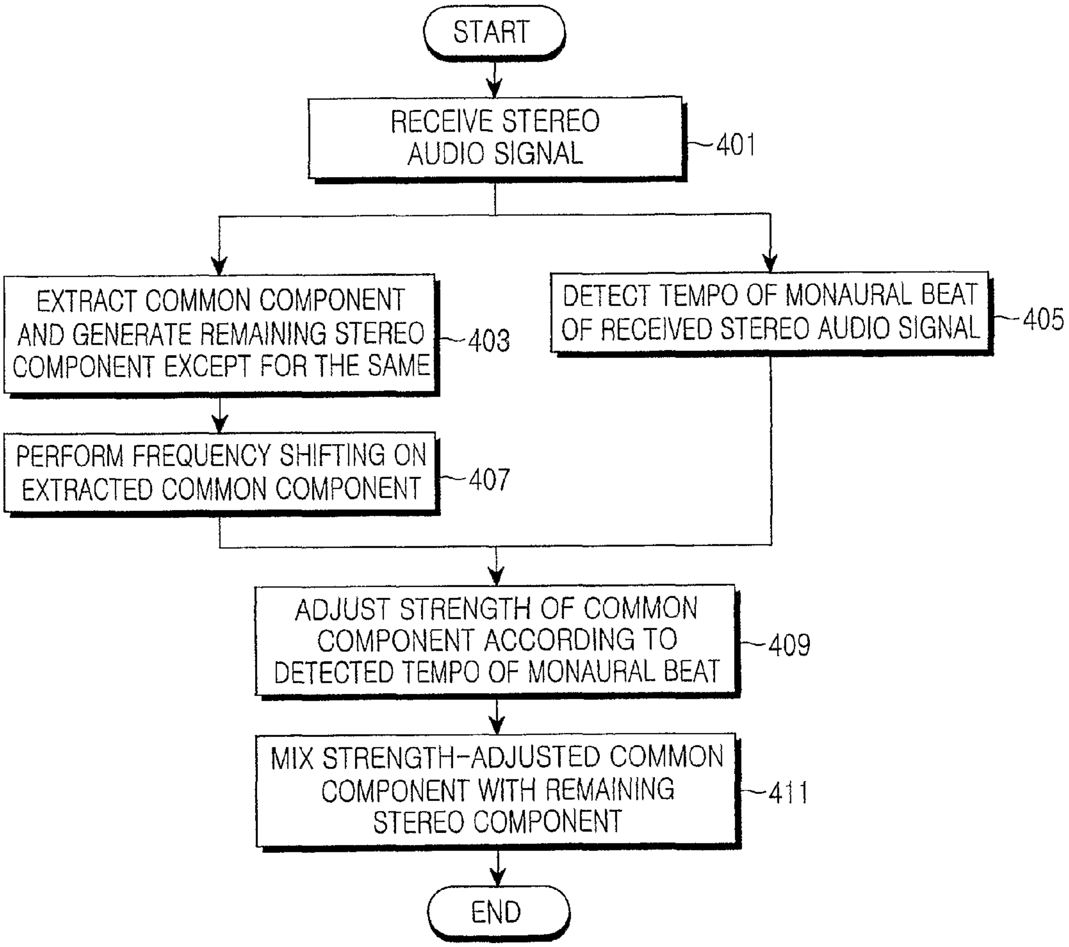
FIG. 4 is a control flow diagram illustrating a method for inducing a brainwave using a stereo audio signal according to an embodiment of the present invention.
Figure 5:
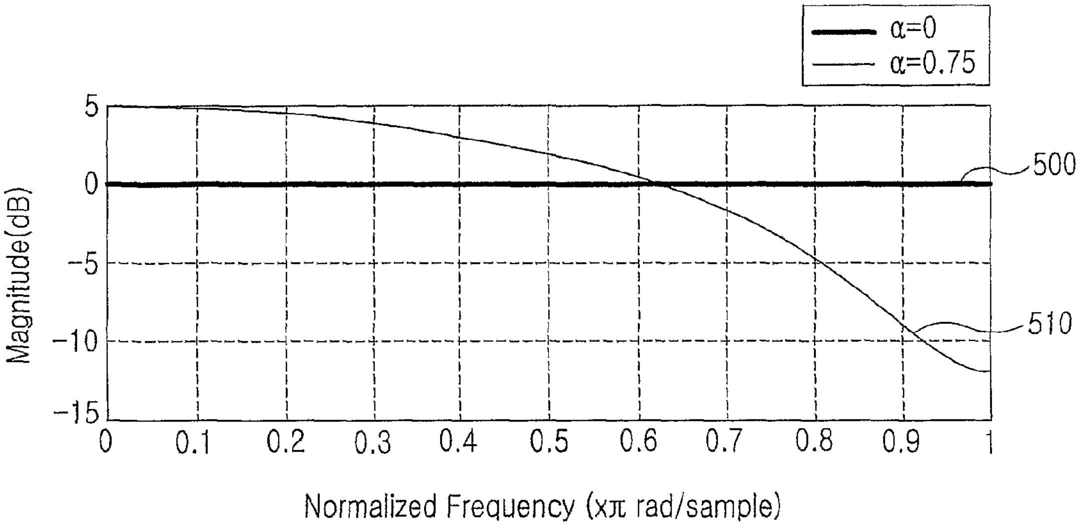
FIG. 5 is a graph illustrating a characteristic of a variable modifier according to an embodiment of the present invention.

With reference to FIGS. 4 and 5, a detailed description will now be made of a process of inducing a brainwave using a stereo audio signal.

FIG. 4 is a control flow diagram illustrating a method for inducing a brainwave using a stereo audio signal according to an embodiment of the present invention. FIG. 5 is a graph illustrating a characteristic of a variable modifier according to an embodiment of the present invention.

When a stereo audio signal is received in step 401, the decorrelator 301 extracts common components existing in both channels of the stereo audio signal, and generates the remaining stereo components except for the common components in step 403.

$$L=C+L'$$

$$R=C+R' \qquad (1)$$

In Equation (1), L and R are input stereo components, C means common components of L and R, and L' and R' are the remaining stereo components obtained by excepting the common components from the input stereo components.

In step 405, the frequency shifter 303 shifts a frequency of the common components extracted by the decorrelator 301, and generates common components including binaural beats. Strengths of the binaural beats in the common components are felt differently according to the tempo of a monaural beat of the received stereo audio signal. For example, when the frequency shifter 303 performs frequency shifting on a fast-beat stereo audio signal, the binaural beat effect may not occur. In this case, therefore, it is possible to prevent distortion of an output audio signal that shows the binaural beat effect, by emphasizing the low-frequency band signal of the common components that underwent frequency shifting. On the contrary, when the frequency shifter 303 performs frequency shifting on a slow-beat stereo audio signal, it is possible to prevent distortion of an output audio signal that shows the binaural beat effect, by emphasizing the high-frequency band signal of the common components.

Therefore, in step 407, the beat detector 305 detects a tempo of a monaural beat of the received stereo audio signal. In step 409, the first variable modifier 307L and the second variable modifier 307R adjust strengths of the binaural beats by adjusting strengths of the common components in which the binaural beats are included, according to the tempo of the monaural beat detected by the beat detector 305, using Equation (2).

$$H(z)=1+\alpha z^{-1} \quad (2)$$

In Equation (2), α corresponding to a tempo of the monaural beat, and z is a frequency. Here, α increases in value as the monaural beat increases. According to the simulation result of FIG. 5, when α=0.75 (510), the low-frequency region increases by 5 dB and the high-frequency region decreases by 8 dB, as compared with when α=0 (500). Therefore, with use of an undepicted variable controller, it is possible to adjust strengths of binaural beats by adjusting strengths of the common components in which the binaural beats are included, according to the tempo of the monaural beat.

In step 411, the first mixer 309L and the second mixer 309R mix the adjusted common components with the remaining stereo components generated in step 403.

As is apparent from the foregoing description, the present invention can generate a binaural beat from a stereo audio signal. Further, the present invention can induce a brainwave to a desired state by generating binaural beats from a stereo audio signal. In addition, the present invention can provide an audio signal to the user without degradation of sound quality, by generating binaural beats from the stereo audio signal and preventing distortion of the stereo audio signal.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An apparatus for generating a binaural beat, the apparatus comprising:

a decorrelator for, upon receipt of a stereo audio signal, extracting a common component existing in both channels of the stereo audio signal and outputting stereo components except for the extracted common component;

a frequency shifter for generating a common component that includes the binaural beat by shifting a frequency of the extracted common component; and first and second mixers for mixing the common component that includes the binaural beat with the remaining stereo components.

2. The apparatus of claim 1, further comprising:

a beat detector for detecting a tempo of a monaural beat of the stereo audio signal; and first and second variable modifiers for adjusting strength of the common component that includes the binaural beat according to the detected tempo of the monaural beat, at both channels of the stereo audio signal.

3. The apparatus of claim 2, wherein the first and second variable modifiers adjust strength of the common component that includes the binaural beat by changing a weight α according to the tempo of the monaural beat according to:

$$H(z)=1+\alpha z^{-1}$$

where α corresponds to the tempo of the monaural beat, and z is a frequency.

4. The apparatus of claim 3, wherein a value of α increases as the monaural beat becomes faster.

5. A method for generating a binaural beat, the method comprising:

upon receipt of a stereo audio signal, extracting a common component existing in both channels of the stereo audio signal and outputting stereo components except for the extracted common component;

generating a common component that includes the binaural beat by shifting a frequency of the extracted common component; and mixing the common component that includes the binaural beat with the remaining stereo components.

6. The method of claim 5, wherein generating a common component that includes the binaural beat further comprises:

detecting a tempo of a monaural beat of the received stereo audio signal; and adjusting strength of the common component that includes the binaural beat according to the detected tempo of the monaural beat, at both channels of the stereo audio signal.

7. The method of claim 6, wherein adjusting strength of the common component that includes the binaural beat further comprises:

adjusting strength of the common component that includes the binaural beat by changing a weight α according to the tempo of the monaural beat according to:

$$H(z)=1+\alpha z^{-1}$$

where α corresponds to the tempo of the monaural beat, and z is a frequency.

8. The method of claim 7, wherein a value of α increases as the monaural beat becomes faster.

* * * * *